United States Patent [19]

Williams et al.

[11] 4,091,407
[45] May 23, 1978

[54] COMBINATION GLASS/LOW TEMPERATURE DEPOSITED $SI_wN_xH_yO_z$ PASSIVATING OVERCOAT WITH IMPROVED CRACK AND CORROSION RESISTANCE FOR A SEMICONDUCTOR DEVICE

[75] Inventors: Robert Powell Williams, Toms River; Murray Arthur Polinsky, Somerville, both of N.J.

[73] Assignee: RCA Corporation, New York, N.Y.

[21] Appl. No.: 737,849

[22] Filed: Nov. 1, 1976

[51] Int. Cl.² ............................................ H01C 29/34
[52] U.S. Cl. ...................................... 357/54; 357/71; 357/73; 427/94
[58] Field of Search ...................... 357/54, 23, 71, 73; 427/93, 94, 95

[56] References Cited

U.S. PATENT DOCUMENTS

| | | | |
|---|---|---|---|
| 3,422,321 | 1/1969 | Tombs | 357/23 |
| 3,424,661 | 1/1969 | Androshuk et al. | 357/54 |
| 3,607,697 | 9/1971 | Shirn et al. | 357/54 |
| 3,635,774 | 1/1972 | Ohta | 357/54 |
| 3,745,428 | 7/1973 | Miswa et al. | 357/54 |
| 3,765,935 | 10/1973 | Rand et al. | 357/54 |
| 3,838,442 | 9/1974 | Humphreys | 357/54 |
| 3,967,310 | 6/1976 | Horiuchi et al. | 357/54 |
| 4,001,871 | 1/1977 | Tsungmitsu | 357/54 |
| 4,001,872 | 1/1977 | Khajezadeh | 357/54 |

OTHER PUBLICATIONS

P. Burkhardt, "Composite Silicon Dioxide-Silicon Oxynitride Insulating Layer," IBM Tech. Discl. Bull, vol. 13, #1, Jun. 1970, p. 21.
G. Ackermann et al., "Process for Deposition of Oxynitride," IBM Tech. Discl. Bull, vol. 15, #12, May 1973, p. 3888.

Primary Examiner—Joseph E. Clawson, Jr.
Attorney, Agent, or Firm—H. Christoffersen; T. H. Magee

[57] ABSTRACT

A semiconductor device having an improved passivating structure comprises a first primary passivating layer free of any layer of silicon nitride ($Si_3N_4$), disposed on a surface of a semiconductor body, a metallic conductor disposed on the first passivating layer, and a secondary passivating overcoat disposed over the metallic conductor, wherein the secondary passivating overcoat includes both a glass layer on the conductor and a low-temperature-deposited (typically 300° C) nitride layer on the glass layer. The device is highly resistant to degradation in the presence of water vapor and corrosive atmospheres.

6 Claims, 1 Drawing Figure

U.S.Patent    May 23, 1978    4,091,407
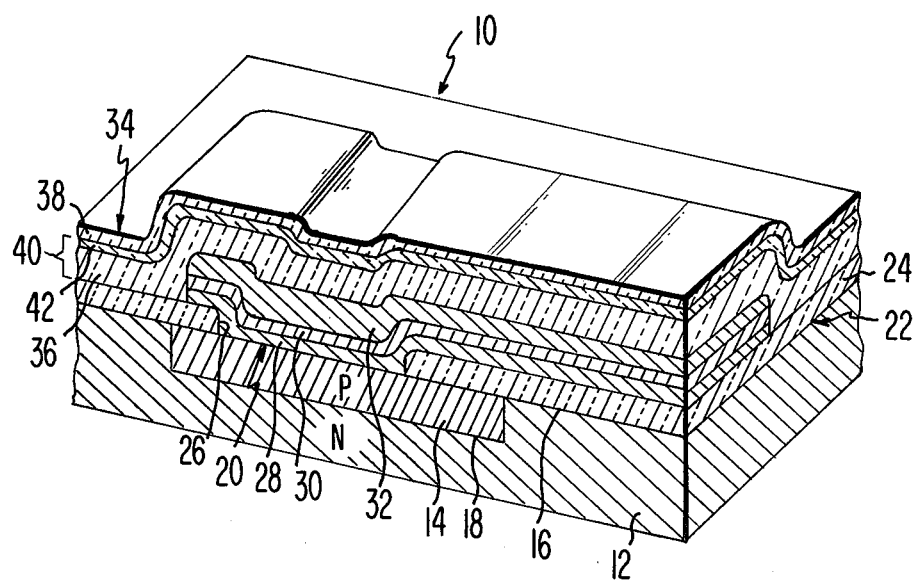

COMBINATION GLASS/LOW TEMPERATURE DEPOSITED SI$_w$N$_x$H$_y$O$_z$ PASSIVATING OVERCOAT WITH IMPROVED CRACK AND CORROSION RESISTANCE FOR A SEMICONDUCTOR DEVICE

This invention relates to an improved passivating structure for a metallized semiconductor device.

In manufacturing semiconductor devices, processing steps are generally performed in order to protect the device against adverse ambient conditions such as high humidity, corrosive vapors, and mechanical abrasion. Such processing steps are typically labeled as "device passivation" which can be grouped into two main types: (1) primary passivation of the semiconductor device surface at and near the termination of a PN junction, and (2) secondary passivation of the essentially finished, metallized device. Both types of passivation are of great practical importance and hence require a high-quality dielectric material that must serve several important functions. The main difference between the two is that primary passivation must effectively protect the immediate semiconductor surface from deleterious contaminants such as ions, metals, and moisture, whereas secondary passivation must protect the entire device surface — both oxide and metal areas — with an overcoating that immobilizes ionic impurities, prevents the penetration of moisture and harmful gases, and at the same time is sufficiently rugged to provide a high degree of mechanical protection. A typical primary passivating layer is disclosed in U.S. Pat. No. 3,597,667, issued to Horn on Aug. 3, 1971, wherein a combination oxide/silicon nitride passivating layer is disposed between the semiconductor surface and the device metallization. The silicon nitride (Si$_3$N$_4$) is deposited prior to forming the metallization, preferably by the reaction of a silicon-containing volatile compound at high temperatures (see U.S. Pat. No. 3,917,495 issued to Horn on Aug. 16, 1974).

One of the earliest forms of secondary passivation is the use of a hermetic metal or ceramic package. But with the demand to increase the packing density of chips in circuitry, hermetic packages become unwieldy and expensive. This has lead to the packaging of many semiconductor devices and circuit modules in organic plastic encapsulating materials which are not the equivalent of a hermetic seal. Unless individual chips are sealed at the chip level, electrical parameters often drift with time, especially during operation at high humidity. Although improvements are being made in plastic packaging materials, there are inherent limitations in encapsulating organic compounds with respect to their purity and permeability to moisture and gases. Consequently, improvements in passivation at the chip level of the semiconductor device are highly desirable. Improved secondary passivation is commonly accomplished with glass materials.

Glass passivation is also used in hermetic devices for several reasons. It covers and insulates the metallization interconnect pattern, preventing possible shorting by loose conducting particles in the hermetic can. If the hermetic enclosure should develop a leak, the glass passivation provides an added safety margin for reliability. The mechanical scratch protection and ambient protection provided by the glass passivation of the semiconductor wafer during processing, dicing, mounting, and wire-bonding of semiconductor wafers and pellets is of paramount importance to safeguard reliability and to maintain high product yield.

Glass frit has been utilized to form a vacuum-tight seal in electron tube applications where portions of a metallic pin are adjacent to a glass structure. In order to form an airtight seal between the glass and the protruding metal pins, such pins have been coated with silicon nitride (Si$_3$N$_4$) by heating the pins in an atmosphere consisting essentially of silicon hydride, ammonia, and argon at about 800° C. The pins are then placed in a mold having a cavity shaped according to the desired glass structure, and the caviy is filled with glass frit. The mold is next heated to a relatively high temperature of about 700° C, at which temperature the glass frit fuses together and is heat-sealed to the Si$_3$N$_4$ coating. This heat-sealing process is described in U.S. Pat. No. 3,635,510, issued to Stoller et al. on Jan. 18, 1972 and assigned to RCA Corporation. Such a high temperature heat-sealing process is not used for conventional semiconductor devices which have the device metallization already in place, since such high temperatures would exceed the eutectic temperature at which the metallic portions of the devices would be likely to alloy with the semiconductor material. Also, the glass-like layer used for semiconductor device passivation is typically chemically vapor-deposited over the entire surface of the semiconductor wafer at a temperature below the metal-semiconductor eutectic temperature.

The terms "glassing" and "glass passivation" are commonly used to denote the process in which a glasslike, amorphous, inorganic dielectric layer is formed over the surface of a completed semiconductor wafer. The sequence for glass passivation normally consists of deposition of the dielectric layer over the entire surface of the wafer, which was previously metallized and the metal delineated, followed by photolithographic delineation to remove glass from the central region of bonding pads and from scribe line areas. Typical glass layers include both silicon dioxide (SiO$_2$) layers and modified silicon dioxide layers, such as, for example, borosilicate glass layers (layers containing chemically-bonded boron trioxide, B$_2$O$_3$) and phosphosilicate glass layers (layers containing chemically-bonded phosphorus pentoxide, P$_2$O$_5$). Such glass layers are generally deposited over the entire surface of the semiconductor wafer using known chemical vapor-depositing techniques. A complete description of one process for chemically vapor-depositing a silicate glass layer is described in U.S. Pat. No. 3,481,781, issued to Werner Kern on Dec. 2, 1969, and assigned to RCA Corporation.

In semiconductor devices having glass layers deposited over metal, cracks and pinholes frequently form in such glass layers when the devices are heated. Such glass layers are typically deposited over metallic conductors such as aluminum or gold, in which the gold may be the top layer of a trimetallization system including a bottom layer of titanium and a middle layer of either platinum or palladium. Glass layers deposited over gold exhibit poor adhesion due to the fact that gold does not readily form a surface oxide that can promote adhesion. As a result, glass layers deposited over gold are of relatively poor quality and invariably crack or peel when subjected to rapid temperature changes. In addition, modified glass layers, such as phosphosilicate glass layers, absorb moisture with the passage of time, resulting in even poorer adherence of the glass layer to the gold. Although glass layers deposited over aluminum conductors exhibit better adhesion and less cracking providing the deposition conditions and composition are carefully controlled, such layers may also crack when heated to higher temperatures, such as 450° C. Since cracking degrades the passivating qualities of glass layers, it is highly desirable to have a passivating overcoat which provides better protection for the semiconductor device. In addition, one of the problems associated with the use of gold as a metallic conductor is that gold atoms migrate (in the presence of water vapor, heat, and operating voltages) away from the conductor and cause shorts to occur, producing inoperable circuit conditions. One of the objectives of the present invention is to provide an improved passivating structure which not only provides effective protection against moisture but also minimizes the total number of passivating layers utilized and thereby requires fewer processing steps.

In the drawing:

The FIGURE is a perspective cross-sectional view showing one embodiment of the novel passivating structure of the present invention.

Referring to the FIGURE there is shown a semiconductor device 10 comprising a silicon wafer 12, initially of one type conductivity, N type as shown in the present example. The wafer 12 typically includes various regions of N and P type conductivity of which only one P type region 14 is shown in the FIGURE. Typically, these regions are adjacent to a surface 16 of the wafer 12 and form PN junctions, such as the junction 18, which define boundaries for the emitter, base and collector regions of transistors disposed in the semiconductor device 10. Above the surface 16 of the wafer is disposed a metallic conductor 20 which interconnects the P type region 14 and various other regions (not shown) into a desired circuit configuration.

A primary passivating layer 22 of insulating material is disposed on the surface 16 of the wafer 12. In the preferred embodiment, the primary layer 22 comprises a single layer 24 of silicon dioxide formed on the surface 16. The silicon dioxide layer 24 may be thermally grown by heating the wafer 12 in an oxidizing atmosphere, such as steam containing HCl formed by boiling a dilute solution of HCl and water, to a temperature of about 950° C for a period of about 1 hour. An opening 26 is formed through the layer 24 to expose a portion of the surface 16 of the wafer 12 where the conductor 20 is to make contact thereto. In the present invention, any layer of silicon nitride ($Si_3N_4$), which in the prior art devices is typically deposited upon the silicon dioxide layer 24, is purposely excluded from the primary passivating layer 22. As explained later, the semiconductor device 10 of the present invention is able to operate without any $Si_3N_4$ layer in the primary passivating layer 22 while still maintaining an improved resistance to degradation in the presence of water vapor and corrosive atmospheres.

The metallic conductor 20 shown in the FIGURE is a multilayered metallization system which is disposed on portions of the primary passivating layer 22. The metallization system comprises a first layer 28 of deposited titanium, a second layer 30 of deposited platinum or palladium, and a third layer 32 of deposited gold. All of these layers function as they do in a conventional beam lead system of the type described in U.S. Pat. No. 3,287,612, which isued to Lepselter on Nov. 22, 1966. The advantage of using such a trimetal system is that the gold layer 32 is highly conductive and corrosion-resistant, the titanium layer 28 forms an adherent bond with the silicon wafer 12 to help prevent lifting of the metallic conductor 20 from the surface 16 thereof, while the layer 30 of platinum or palladium acts as a barrier metal to help insure that the gold does not penetrate to the silicon wafer 12, since this is generally undesirable. Although a trimetal system is illustrated for the metallic conductor 20 shown in the FIGURE, such a conductor may comprise simply a single metallic layer, such as a layer of aluminum.

A secondary passivating overcoat 34 is disposed over the top of the wafer 12, including the unmetallized portions of the layer 24 and the exposed portions of the conductor 20. In accordance with the present invention, the passivating overcoat 34 comprises a combination glass/nitride structure which includes a glass layer 36 disposed over the layer 24 and the exposed portions of the conductor 20, and a low-temperature-deposited nitride layer 38 disposed over the glass layer 36. The expression "low-temperature-deposited" means a nitride layer 38 deposited at a temperature below the eutectic temperature at which the metallic conductor 20 may alloy with the semiconductor material such as, for example, the Au-Si eutectic temperature of about 370° C. The nitride layer 38 and the glass layer 36 have typical thicknesses of between about 500A and about 15,000A. Referring to the FIGURE, there is illustrated one embodiment for such a combination passivating overcoat 34 wherein the glass layer 36 may comprise the first layer of a multilayered glass structure 40 which includes a second glass layer 42. Typically, one of the glass layers such as, for example, the glass layer 36, may be phosphosilicate glass (PSG), while the other glass layer, i.e., the second glass layer 42, may be a capping layer of undoped silicon dioxide. Preferably, the PSG layer has a thickness of between about 10,000A and about 15,000A, and the silicon dioxide layer has a thickness of between about 1000A and about 2000A. If desired, the second glass layer 42 may be eliminated, and the nitride layer layer 38 may be disposed directly over the glass layer 36.

The layers 36 and 42 are preferably formed in the following manner. The silicon wafer 12 is heated in a conventional reactor to a temperature of approximately 325° C. To form the phosphorus-doped layer 36, the following gases are introduced into the reactor. The flow rates of the gases are controlled in any commonly known manner to provide the following proportions of the gases, relative to the one percent phosphine-nitrogen component:

Nitrogen: 500 parts
Oxygen: 120 parts
3% Silane (balance nitrogen): 14.1 parts
1% Phosphine (balance nitrogen): 1 part.

The production of the gases are given in this manner because the actual flow rates are dependent on the particular apparatus used. In general terms, there should be about 14 times as much 3% silane as there is 1% phosphine, enough oxygen to carry the reaction to completion, and whatever amount of nitrogen (or other inert gas) as is necessary to create turbulence in the reactor, if such turbulence is required. Under these conditions, the phosphorus-doped layer 36 grows at a rate of approximately 700A per minute. Consequently, when the deposition is carried out for approximately 20 minutes, the phosphorus-doped layer 36 grows to a thickness of 14,000A.

After 20 minutes of deposition, the flow of phosphine is stopped, so that only the silane, oxygen, and nitrogen flows continue. This produces the undoped layer 42. About 1000A of this layer are deposited when the procedure is carried out for about 1.5 minutes.

The method used for depositing the nitride layer 38 is limited to a relatively low-temperature process due to the fact that the device metallization is already in place at the time that the nitride layer 38 is to be formed. The nitride layer 38 should be deposited at a temperature of between about 50° C and about 350° C in order to avoid possible alloying between the metallic conductor 20 and the underlying semiconductor material. For example, where the conductor 20 comprises both gold and titanium, the nitride layer 38 should be deposited at a temperature of approximately 200° C, since any gold that contacts the silicon through imperfections in the platinum or palladium barrier layer 30 may alloy with the silicon at the Au-Si eutectic temperature of about 370° C, or the gold, silicon and titanium may alloy at a temperature of about 280° C. Although the Al-Si eutectic temperature of about 577° C is slightly higher, a nitride layer cannot be chemically vapor-deposited over aluminum because a high deposition temperature of about 850° C is required in the chemical vapor-deposition processes. Consequently, nitride layers which are chemically vapor-deposited generally have to be deposited prior to forming the device metallization.

In the preferred embodiment, the nitride layer 38 is deposited at relatively low temperature by an rf glow discharge plasma reaction in an atmosphere selected from the group consisting of silane and nitrogen, silane and ammonia, and silane, nitrogen and ammonia. For further information on the known use of a plasma reaction in depositing a nitride layer, see Rosler et al., "A Production Reactor for Low Temperature Plasma-Enhanced Silicon Nitride Deposition," *Solid State Technology*, June 1976, pages 45 to 50. The nitride layer 38 may also be deposited at low temperature by either reactive rf sputtering in nitrogen using a silicon target, or direct rf sputtering using a silicon nitride target. Such rf sputtering techniques are also known in the art; for further information see J. L. Vossen, "Control of Film Properties by rf-Sputtering Techniques," *Journal of Vacuum Science and Technology*, Vol. 8, No. 5, September/October 1971, pages S12 to S30.

The nitride layer 38, when deposited by glow discharge plasma reaction from silane and nitrogen, with or without ammonia, at typically 300° C, is not stoichiometric $Si_3N_4$ but comprises an amorphous, and probably a polymeric chemical compound having the formula $Si_wN_xH_yO_z$, wherein $w$, $x$, $y$ and $z$ are integers other than zero. The proportion of these elements differs substantially with deposition conditions, giving rise to nitride layers with widely ranging properties. This conclusion is based to a large extent on infrared spectroscopic data that reveal the presence of Si-N, Si-H, Si-NH-Si, Si-OH, and possibly Si-O and N-H groups.

Low-temperature nitride layers, whether deposited by plasma reaction, reactive rf sputtering, or direct rf sputtering contain background gases as solid solutions or loosely-bonded molecules which tend to make such nitride layers thermodynamically unstable. Any agent, such as heat or impurities, which disturbs this metastable state may cause spontaneous release of the dissolved gas, resulting in blisters or bubbles which degrade the integrity of the secondary passivating overcoat. It has been observed that heating of such nitride layers may cause blistering due to outgassing of the dissolved background gases, such as argon which may become dissolved in nitride layers deposited by rf sputtering. In the preferred embodiment of the present invention, a controlled amount of oxygen or oxygen-containing gas is bled into the reaction chamber so that the low-temperature nitride layer 38 being formed will contain silicon oxynitride. It has been found that nitride layers containing substantial amounts of Si-O linkages are much less prone to blistering, and appear to be much more stable, especially during subsequent heating operations.

The combination glass/nitride passivating overcoat 34 provides an excellent protective structure which exhibits a greatly improved resistance to cracking and peeling, thereby ensuring better reliability for semiconductor devices. Experiments have shown that the adherence of a glass layer to a metallic conductor, especially a layer of gold, is initially acceptable, but deteriorates after the layer is exposed for a short period of time to ambient air which is relatively humid, resulting in peeling or cracking of the glass layer. Forming the low-temperature-deposited nitride layer over the glass layer, before the glass layer has been exposed to such humidity, prevents the degradation of the adherence between the glass layer and metallic conductor. The nitride layer acts as a moisture diffusion barrier which seals off the underlying glass layer from the ambient air which may contain undesirable moisture. Although a low-temperature-deposited nitride layer by itself would not provide adequate dielectric protection needed for effective overcoat passivation because such nitride layers exhibit poor structural integrity, a combination glass/nitride structure provides a passivating overcoat which offers substantially improved integrity against cracking. The underlying glass layer not only provides ample dielectric and mechanical protection for the semiconductor device but also acts as an effective getter for harmful ion impurities such as, for example, sodium ions.

The overlying low-temperature-deposited nitride layer acts not only as a sealant for the underlying glass layer which prevents the degradation in structural quality of the glass layer, and thereby allows the glass layer to retain its adherence to the underlying metallic conductor, but, more importantly, acts as an effective barrier to alkali ion migration. Sodium ions, in particular, are the cause of excessive mobile charge and result in surface inversion layers and/or reverse-bias leakage currents. Semiconductor devices are typically exposed to such alkali ions in the presence of water vapor and corrosive atmospheres. We have discovered that the low-temperature-deposited nitride layer is effective enough as a barrier against alkali ion penetration into the surface of the semiconductor device, to allow the typical CVD layer of $Si_3N_4$ beneath the metallic conductor to be completely eliminated. By utilizing the overlying (the conductor) nitride layer as a moisture diffusion barrier against harmful ion impurities, such as sodium ions, the total number of passivating layers required is reduced, since the underlying (the conductor) $Si_3N_4$ layer may be eliminated without significantly sacrificing device quality. Consequently, fewer processing steps are required to manufacture the novel passivating structure, and economies in production are achieved without any significant degradation of the device in the presence of water vapor and other corrosive atmospheres.

What is claimed is:

1. A semiconductor device having an improved passivating structure, resistant to degradation in the presence of water vapor and corrosive atmospheres comprising:
   a semiconductor body having a surface and PN junction-defining regions in said body adjacent to said surface,
   a primary passivating layer of insulating material disposed on said surface, said primary passivating layer free of any layer of silicon nitride ($Si_3N_4$),
   a metallic conductor disposed on portions of said primary layer, and
   a secondary passivating overcoat disposed over exposed portions of said conductor and unmetallized portions of said primary passivating layer, said secondary overcoat including a glass layer and a low-temperature-deposited nitride layer comprising a chemical compound having the formula $Si_wN_xH_yO_z$, wherein $w$, $x$, $y$, and $z$ are integers other than zero, said low-temperature-deposited nitride layer being deposited at a temperature below the eutectic temperature at which said metallic conductor begins to alloy with the semiconductor material.

2. A semiconductor device as defined in claim 1 wherein said low-temperature-deposited nitride layer is disposed over said glass layer.

3. A semiconductor device as defined in claim 1 wherein said low-temperature-deposited nitride layer has a thickness of between about 500A and about 15,000A.

4. A semiconductor device as defined in claim 1 wherein said glass layer is phosphosilicate glass and has a thickness of between about 500A and about 15,000A.

5. A semiconductor device as defined in claim 1 wherein said conductor comprises a layer of aluminum.

6. A semiconductor device as defined in claim 1 wherein said conductor comprises a first layer of titanium, a second layer of one platinum and palladium, and a third layer of gold, said gold layer being adjacent to said glass layer.

* * * * *